(12) United States Patent
Greene et al.

(10) Patent No.: US 6,963,295 B1
(45) Date of Patent: Nov. 8, 2005

(54) METHOD OF RECOVERING AND DECODING OF MANCHESTER CODED DATA

(75) Inventors: John C. Greene, Allen, TX (US); Krishna Doddamane, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/884,429

(22) Filed: Jul. 2, 2004

(51) Int. Cl.$^7$ .............................................. H03M 7/12
(52) U.S. Cl. ........................................ 341/70; 342/42
(58) Field of Search ............................ 341/70, 50, 51; 342/42

(56) References Cited

U.S. PATENT DOCUMENTS 5,053,774 A    10/1991  Schuermann et al.
5,347,280 A *  9/1994   Schuermann ................ 342/42

OTHER PUBLICATIONS

Presentation entitled Keeping Pace With RFID presented by Lowry Computer Products, date unknown.
Manual entitled TI–RFID Product Manuals dated Nov. 2001.
Paper entitled The Cutting Edge of RFID Technology and Applications for Manufacturing and Distribution by Susy d'Hont of Texas Instruments TIRIS, date unknown.

* cited by examiner

*Primary Examiner*—Peguy JeanPierre
*Assistant Examiner*—Joseph Lauture
(74) *Attorney, Agent, or Firm*—Russell E. Baumann; Frederick J. Telecky, III

(57) ABSTRACT

A method and apparatus for accurately decoding a Manchester data stream having transition time distortion and noise spikes. Briefly, in an embodiment using a protocol where a falling edge at the mid-point of a bit represents a "1" bit and a rising edge at the mid-point represents a "0" bit, the coded data can be accurately determined by comparing the time period $tp_1$ from the start of the bit to the first falling edge and the time period $tp_2$ from the last rising edge to the end point of the bit. If $tp_1$ is less than $tp_2$, the bit represents a bit value of "0" and if $tp_2$ is less than $tp_1$, the bit represents a bit value of "1".

15 Claims, 2 Drawing Sheets

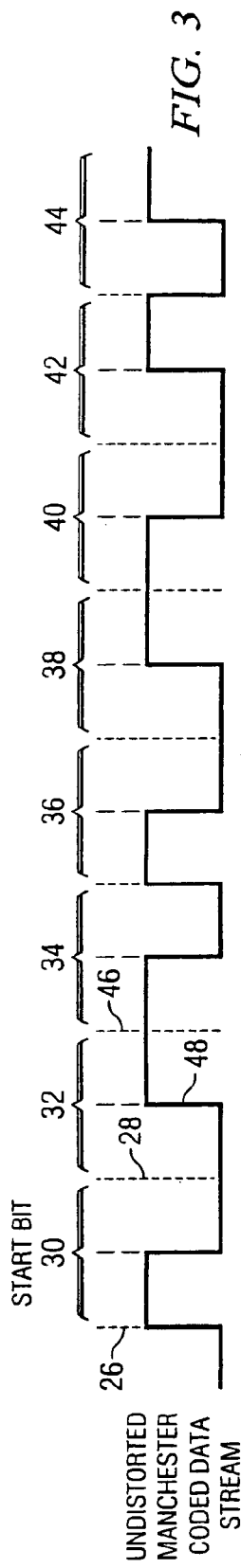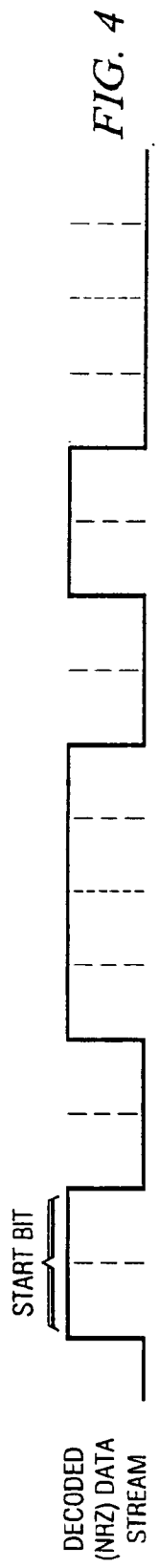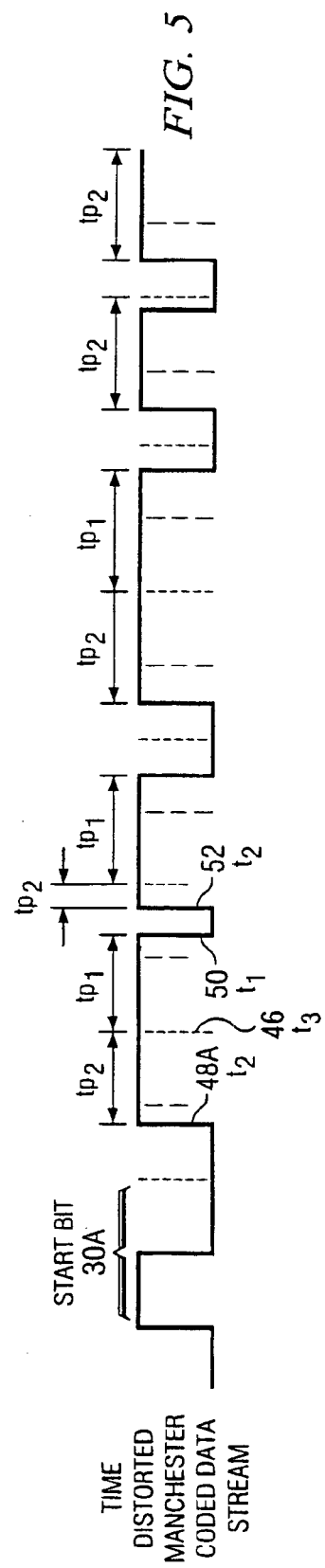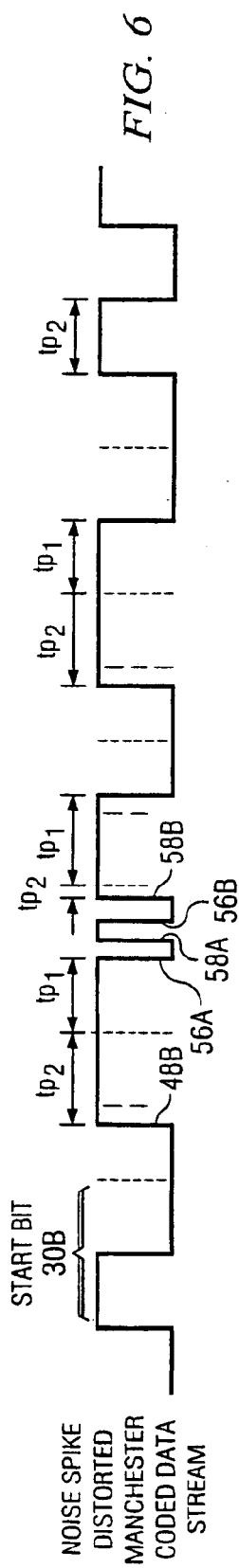

US 6,963,295 B1

METHOD OF RECOVERING AND DECODING OF MANCHESTER CODED DATA

TECHNICAL FIELD

The present invention relates generally to the field of Radio Frequency Identification Device (RFID) such as, for example, a transponder arrangement comprising an interrogation unit, which transmits an RF interrogation pulse to at least one transponder, which then returns stored data back to the interrogation unit in the form of a modulated RF carrier. The data carried by the RF carrier may be coded in a Manchester-coded format. The interrogation unit may then operate to transmit control data to the transponder unit, which may then initiate actions dependent upon the received data. Alternately, the interrogation unit may simply monitor and collect the data for purposes of record keeping or reporting.

More specifically, the invention relates to the recovery and prompt and effective decoding of the Manchester-coded data stream.

BACKGROUND

There is a need for devices or apparatus, which make it possible to identify or detect items or objects in a contactless manner. Such devices or apparatus may be manufactured integral with or attached to the object being identified. It is also important that such devices operate effectively and accurately within a selected distance from an interrogation unit and that the device be inexpensive.

More specifically, it is, for example, desirable to receive the unique identification, which is assigned to an object and which is stored in the device or apparatus in a contactless manner and over a specified distance. A determination may also be made as to whether or not a particular object exists within a given reading range. Still other embodiments may provide information concerning physical parameters, such as a temperature or a pressure related to the monitored item in addition to providing a unique identification when direct access to the object is not possible.

According to other uses, a device or apparatus can, for example, be attached to an animal, which can then always be identified at an interrogation point, a threshold or feed location without direct contact. There is also a need for such a device, which when carried by a person, permits access checking, such that only persons whose transponder units return certain identification data to the interrogation unit are allowed access to a specified area. In this case, the safeguarding of the data transfer, such as by encryption, may be a very essential factor in the production of such devices. Still another example in which such a device is needed is the computer-controlled industrial production in which, without the intervention of operating personnel, components may be taken from a store, transported to a production location and there assembled to give a finished product. In this case, a device is required, which can be attached to the individual components so that the components can be specifically detected in the storage location and such that removal is monitored and recorded. Typically, coded data transmitted to an interrogation unit is a sufficiently robust signal that it can be clearly identified from noise and spurious signals having a frequency within the frequency bandwidth of the transmitted data. However, as was mentioned above, if such RFID devices are to be used extensively, they are preferably inexpensive to manufacture and may be substantially disposable one-use devices. Therefore, to keep costs low many of these inexpensive transponder devices do not use a battery or other active power source, but instead may simply comprise a capacitor that collects and stores RF energy transmitted from the interrogation unit. This stored energy is then used for providing the identifying data transmission. Even if the device does include a small active power source, the power source may also be needed for data collection and data processing by the RFID unit. Therefore, the power level of the transmitted data may be very low. Low power levels for the transmitted data mean that noise may corrupt the transmitted coded data.

Therefore, it would be advantageous to provide an effective technique for the interrogation unit to receive the transmitted data stream and accurately decode the data even when corrupted by noise.

SUMMARY OF THE INVENTION

These and other problems are generally solved or circumvented, and technical advantages are generally achieved, by preferred embodiments of the present invention, which provides methods and apparatus for recovering and decoding Manchester-coded signals transmitted from an RFID device that may be corrupted or distorted by noise.

More specifically, and according to the invention, an interrogation unit receives a series of Manchester-coded data bits. The unit includes circuitry for determining the start point or time ($t_0$) and an end point or time ($t_3$) of the Manchester-coded data bits as well as circuitry for determining the occurrence of the first negative (or positive) voltage transition and circuitry to determine the occurrence of the last positive (or negative) voltage transition for such transitions occurring between the start time and end time of the data bit. According to one embodiment, a first time period representative of the time between the start time ($t_0$) and the time ($t_1$) the first negative (or positive) voltage transition occurs is compared to a second time period representing the time between the occurrence of the last positive (or negative) voltage ($t_2$) transition and the end time or point ($t_3$). A Manchester-coded bit transitioning from a high value to a low value at the mid-point, may be selected to represent a "0" bit whereas a coded bit transitioning from a low value to a high value at the mid-point would be chosen to represent a "1" bit. However, it should be appreciated that a transition from a high value to a low value could represent a "1" bit and a transition from a low value to a high value could represent a "0" bit. According to the present invention, when a transition from a high value to a low value represents a "0" bit for the Manchester-coded bit, if the first time period is less than the second time period, the decoded bit is a "0" and if the first time period is greater than the second time, the decoded bit is a "1".

According to another embodiment of the invention, there are included a first, second, third and fourth counters where the first counter represents the time to of the start point, the second counter represents the time $t_1$ that the first negative (or positive) transition occurs, the third counter represents the time $t_2$ that the last positive (or negative) transition occurs, and the fourth counter represents the time $t_3$ of the end point. Thus, the first time period is the difference between the number of clock pulses counted by the first and second counters and the second time period is the difference between the number of clock pulses counted by the third and fourth counters.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 2A represents a "1" bit and FIG. 2B represents a "0" bit;

FIG. 3 is an uncorrupted example of a stream of Manchester-coded signals or data bits representing the bit code 10110100;

FIG. 4 is an example of data bits displayed in the desired NRZ format (non return to zero) of the data bit stream 10110100 after decoding;

FIG. 5 is an example of a time distorted stream of Manchester-coded signals or data bits representing the bit code 10110100; and FIG. 6 is an example of a noise distorted stream of Manchester-coded signals or data bits representing the bit code 10110100.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
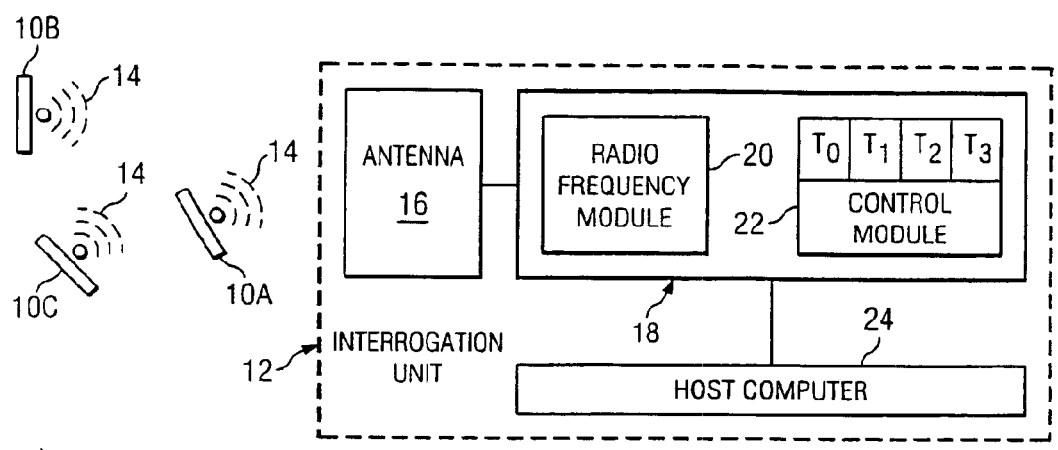
FIG. 1 is a block diagram of a typical arrangement of an RFID transponder device or unit and an interrogation unit.

Referring now to FIG. 1, there is shown a block diagram of a typical arrangement of three RFID transponders 10a, 10b and 10c and an interrogation unit 12. Each of the transponders 10a, 10b and 10c will typically have a unique identifier tag or code and may also include other information related to environmental conditions or performance characteristics of the responder itself or the item to which it is attached. Each of the transponders will generate RF (radio frequency) signals 14 that carry the unique identifier information and any other information collected or stored. In addition, each transponder will receive a start of power or power-up signal (not shown) from interrogation unit 12. The transponder may also receive one or more request signals that identify information that is to be transmitted to the interrogation unit 12. Manchester-coded RF signals have been found to be particularly useful in such devices. A Manchester code is defined as a data and clock signal combined to form a single self-synchronizing data stream where a transition from a 0 voltage level to a high level or from a high level to a low level occurs at the mid-point of each bit.

The RF signals generated by the transponders are received by an antenna 16 at the interrogation unit 12. The raw encoded carrier signal is then provided to receiving circuitry 18 in the interrogation unit 12, which typically will include an RF module or portion 20 and a control module 22. The receiving circuitry 20 will then condition and/or process the received carrier signals to recover the data stream in the Manchester-coded format. The information decoded from the Manchester-coded format and contained in the processed or RF signals is then provided to a host computer 24, which may be part of the interrogation unit 12 itself, as shown, or alternately, may be a separate computer that is linked to the interrogation unit when necessary to exchange data.

Figure 2A:
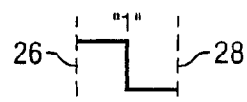
FIGS. 2A and 2B illustrate typical undistorted Manchester-coded bits.
Figure 2B:
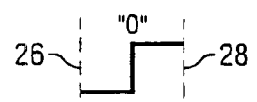

As discussed above, the use of Manchester-coded signals have been found to be particularly useful with RFID transponders. FIGS. 2A and 2B illustrate the two possible undistorted wave shapes when the selected protocol is selected such that the bit is a "1" and a "0", respectively, extending between a start point represented by dotted line 26 and an end point or time at dotted line 28. This convention is used herein, but those skilled in the art will understand that the opposite and reversed protocols could be used. That is, FIG. 2A could represent a "0" bit and FIG. 2B could represent a "1" bit. As used, therefore, the basic rule for the illustrated embodiments is that a half bit of logic low followed by a half bit of logic high represents a "0" bit. Whereas, a half bit of logic high followed by a half bit of logic low represents a "1" bit. Since most switching circuits that may be used for such coding signals will be manufactured with the use of FETs, it will be appreciated that a falling or negative voltage transition will have a steeper slope than a rising or positive voltage transition. Therefore, in the example a low level or zero voltage will also always be a valid condition whereas a high or positive level could simply be noise.

Unfortunately, a corrupted or distorted Manchester code is not going to be limited to the wave or bit shapes such as shown in FIGS. 2A and 2B. More specifically, the bit code may include timing distortions such that the transition from a high level to a low level or a low level to a high level may not occur at the mid-point of the bit. In addition, there may also be two or even more positive and negative voltage transition in a single bit due to noise. Consequently, whether the bit is a "1" or a "0" may not be easily determined.

However, as was discussed above, because a low level is always a valid condition, a protocol is provided according to the present invention that can accurately identify or determine whether a distorted Manchester-coded bit is a "1" bit or a "0" bit. This solution considers bit parameters such as the location of the pulse between the beginning and the end points of a bit and the width of the pulses and the most representative polarity/logic level of the bit waveform. More specifically, by measuring the first occurrence (a positive or negative voltage transition) of the most representative logic level of the bit waveform, and also determining the last occurrence of a rising (or falling) edge or positive (or negative) transition, it is possible to identify a pulse while at the same time recognizing and ignoring the remaining intermediate transitions as noise. The measurements are then used to properly place the representative pulse in the proper half of the bit and thereby decode the bit.

To accomplish this in the embodiment illustrated in the figures, the following protocol rules are followed. "$t_0$" represents the beginning point or beginning time of a Manchester-coded bit, and "$t_3$" represents the end point or end time of the bit. "$t_1$" represents the time that the first falling edge or negative voltage transition occurs, "$t_2$"

represents the time that the last rising edge or positive voltage transition occurs, $tp_1$ (time period) represents the time elapsed between $t_0$ and $t_1$, and $tp_2$ represents the time elapsed between $t_2$ and $t_3$. Therefore, assuming the Manchester bit pattern shown in FIGS. 2A and 2B represent a "1" bit and a "0" bit, respectively, it can be determined that if $tp_1$ is less than $tp_2$ (i.e., $tp_1 < tp_2$) then the pulse is located in the first half of the bit and represents a "0" bit. On the other hand, if the $t_2$ is less than $t_1$ (i.e., $t_2 < t_1$) then the pulse is located in the second half of the bit and the bit represented is a "1" bit. Also, as will be discussed in more detail later, it is possible that a "0" bit, as an example, will not include a falling edge at all. That is, the bit starts at $t_0$ at a low or zero level, has a rising edge to a high level and then remains high throughout the rest of the bit to the end point or time $t_3$. In a similar manner, as will be discussed, it is also possible that a "1" bit will not have a rising edge. That is, the bit starts high, has a falling edge and then stays at a low level to the end of the bit.

Therefore, in an embodiment using the condition where there is no falling edge, set $t_1$ equal to $t_0$ so that $tp_1=0$, and for the condition where there is no rising edge, set $t_2$ equal to $t_3$ so that $tp_2=0$.

More specifically, referring now to FIG. 3, there is illustrated an uncorrupted Manchester-coded data stream representing the data bits 10110100. The first bit or "start bit" 30 as represented by bracket 30 that extends between dotted lines 26 and 28 is a "1" bit and is used as a reference. The next seven bits 32 through 44 represent data bits having the values 0110100, respectively. Also as shown, the end point or time "$t_3$" for start bit 30 occurs at dotted line 28, which also represents "$t_0$" for the first data bit 32. Similarly, the end point or time $t_3$ for the first data bit 32 is at dotted line 46, which also represents the start time or point for the second data bit 34. Thus, the $t_3$ time or end point for a data bit is also the $t_0$ or start point for the next or following data bit. Therefore, since in the illustrated example of the figures a falling edge at the mid-point represents a "1" bit and a rising edge at the mid-point represents a "0" bit, it can be ascertained that the bits 30 through 44 do represent the data stream 10110100 in an uncorrupted Manchester code including the start bit.

FIG. 4 represents the resultant decoded data stream in an NRZ (non return to zero) format, which of course also represents the stream of data bits 10110100.

As discussed above, the Manchester code may experience time distortion such that the falling edge or rising edge does not occur at the mid-point of the data bit. Therefore, referring now to FIG. 5, there is shown a time distorted Manchester code that represents the bits 30a through 44a including start bit 30, which also represent the data stream 10110100. As shown, the start bit 30a is not distorted and appears the same as the start bit 30 in FIG. 3. However, the rising edge 48 is not at the mid-point of data bit 32a. Therefore, using the protocol discussed above, it is seen that there is no falling edge and, therefore, $t_1$ is set to equal ($t_0$), which means $tp_1=0$ ($t_1-t_0=0=tp_1$). $tp_1$, however, is equal to the time period between the rising edge 48 (which is also $t_2$) and the end point $t_3$. Since $tp_1$ is equal to "0" and $tp_2$ clearly represents a time period greater than 0, it is clear that $tp_2$ is greater than $tp_1$ such that the pulse is located in the first half of the bit and represents a "0" bit according to the selected protocol. On the other hand, it is seen for data bit 34a that $tp_1$ represents a time period from $t_0$ on line 46 to the falling edge 50 at $t_1$, which is greater than half of the total bit, whereas $tp_2$ is a much shorter time period from rising edge 52 ($t_2$) to the end point $t_3$. Therefore, it is clear that $tp_1$ is greater than $tp_2$ and, therefore, the data bit represents a bit value of "1". The same technique can also be used to verify that bits 36a through 44a represent the bit value 10100 just as did the bits 36 through 44 of FIG. 3.

As was discussed above, the Manchester code can also be distorted by noise causing spikes, which are manifested by false positive or rising edges. Therefore, FIG. 6 represents Manchester-coded data bits corrupted by both time distortion and noise spikes. The stream of data bits illustrated in FIG. 6 again represent the bit code 10110100 as did FIGS. 3 and 5. As shown in FIG. 6, the start bit 30b is again undistorted as noise has not yet had time to affect the received signal. Also, as was the case shown in FIG. 5, the rising edge 48b associated with bit 32b occurs before the mid-point of the bit such that $tp_2$ is substantially the same as $tp_2$ associated with bit 32a in FIG. 5. Further, since there is no falling edge, $tp_1$ is set to $t_0$ and, therefore, equals "0" just as it did with respect to bit 32a in FIG. 5.

It has also been determined that the distance a transponder 10 is from the reader or interrogation unit 12 determines the effects noise has on the Manchester code received by the interrogation unit. More specifically, when the transponder is very close to the reader, noise manifests itself as a time distortion shift of the falling or rising edge. However, as the distance between a transponder and reader increases, the time distortion decreases and noise spikes often appear.

However, it is seen that there are two falling edges 56a and 56b associated with bit 34b. There are also two rising edges 58a and 58b. Therefore, it will be recalled that, according to the protocol of this invention, $tp_1$ is defined as the time period between the start point or time $t_0$ of the bit and the first falling edge as is represented by $t_1$. Therefore, in FIG. 6, bit 34b $tp_1$ appears to be about ½ of a total bit. Likewise, $tp_2$ was defined as the time period between the "last" rising edge 58b indicated as $t_2$ and the end point or time defined as $t_3$. Therefore, $tp_2$ for bit 34b in FIG. 6 represents a very small time period as the last rising edge 58b occurred just before the end point or time of the bit. Therefore, $tp_2$ is less than $tp_1$ and, therefore, the bit represents a bit value of "1". Consequently, this also means that the wave spike defined by rising edge 58a and falling edge 56b is simply a noise spike that should be ignored. Bits 36b and 38b of FIG. 6 are similar to those wave shapes of bits 36a and 38a of FIG. 5 except the rising and falling edges of these bits are closer to the ideal bit and that they occur almost at the mid-point. The three bits 40b, 42b and 44b are all similar to the corresponding bits 40, 42 and 44 of FIG. 3 in that the voltage transitions all occur at the mid-point.

Therefore, it is seen that the protocol of the present invention allow for accurate decoding of Manchester-coded data streams even when the stream includes time distortion and noise spikes. It should also be remembered that the inventive process is also appropriate when a rising edge at the mid-point represents a "1" bit and a falling edge represents a "0" bit. Similarly, $tp_1$ could represent the time period from the start point to the first rising edge and $tp_2$ would represent the time period from the last falling edge.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of receiving and decoding transmitted Manchester-coded data signals comprising the steps of:
   receiving a series of Manchester-coded bits at an interrogation unit;
   determining a start point and an end point of each of said Manchester-coded data bits;
   measuring a first time period between said start point and a selected first one of a negative and positive voltage transition that occurs during one of said Manchester-coded data bits after said start point;
   measuring a second time period between the end point and the last of the other one of a negative and positive transition;
   comparing said first time period and said second time period;
   determining that said Manchester-coded data bit is representative of one of a "0" bit and a "1" bit if said first time period is less than said second time period; and
   determining that said Manchester-coded data bit is representative of the other one of a "0" bit and a "1" bit if said first time period is greater than said second time period.

2. The method of claim 1 further comprising the steps of determining a time value ($t_0$) at the occurrence of said start point, a time value ($t_1$) at the occurrence of said first negative transition, a time value ($t_2$) at the occurrence of said first positive transition and a time value ($t_3$) at the occurrence of said end point, and wherein said step of measuring a first time period comprises determining the difference in time values $t_0$ and $t_1$ and said step of measuring a second time period comprises determining the difference in time values $t_2$ and $t_3$.

3. The method of claim 2 wherein a transition timing of said Manchester-coded data bit has been distorted.

4. The method of claim 2 wherein said Manchester-coded data bit has been distorted by noise.

5. The method of claim 2 wherein said Manchester-coded bits are provided by an RFID (Radio Frequency Identification Device).

6. The method of claim 1 wherein said first time period is between said start point and the first negative voltage transition and said second time period is between said end point and the last positive voltage transition.

7. The method of claim 6 wherein said data bit represents a "0" when said second time period is greater than said first time period.

8. The method of claim 1 wherein said first time period is between said start point and the first positive transition and the second time period is between the end point and the last negative voltage transition.

9. The method of claim 1 wherein a transition timing of said Manchester-coded data bit has been distorted.

10. The method of claim 1 wherein said Manchester-coded data bit has been distorted by noise.

11. The method of claim 1 wherein said Manchester-coded bits are provided by an RFID (Radio Frequency Identification Device).

12. An interrogation unit for receiving a series of Manchester-coded data bits from a transmitter comprising:
   circuitry for providing a start point and an end point of each of said Manchester-coded data bits;
   circuitry for detecting the occurrence of a selected first one of a negative and positive voltage transition after said start point;
   a first device for measuring a first time period between said start point and said first voltage transition;
   circuitry for detecting the occurrence of a last voltage transition, said last voltage transition being a last of a negative and positive voltage transition, that occurs after the first voltage transition and up to said end point;
   a second device for measuring a second time period between said last voltage transition and said end point;
   a comparison unit for comparing said first time period and said second time period; and
   circuitry for determining that the Manchester-coded data bit is representative of one of a "0" bit and a "1" bit when said second time period is greater than said first time period and determining the Manchester-coded bit is representative of the other one of a "0" bit and a "1" bit when said first time period is greater than said second time period.

13. The interrogation unit of claim 12 wherein said circuitry for determining said start point, said circuitry for detecting said first occurrence of a negative transition, said circuitry for detecting said last occurrence of a positive transition, and said end point comprises first, second, third and fourth counters that count clock pulses for respectively determining a value $t_0$ at the occurrence of said start point, a value $t_1$ at the occurrence of said first negative transition, a value $t_2$ at the last occurrence of a positive transition and a value $t_3$ at the occurrence of said end point, wherein said first device for measuring said first time period is a first comparator unit for determining the difference in the number of clock pulses between values $t_0$ and $t_1$, and wherein said second device for measuring said second time period is a second comparator unit for determining the difference in the number of clock pulses between value $t_2$ and value $t_3$.

14. The interrogation unit of claim 13 wherein said transmitter is an RFID (Radio Frequency Identification Device).

15. The interrogation unit of claim 12 wherein said transmitter is an RFID (Radio Frequency Identification Device).

* * * * *